(12) United States Patent
Xue et al.

(10) Patent No.: US 7,609,063 B2
(45) Date of Patent: Oct. 27, 2009

(54) MOBILE POSITIONING DEVICE FOR MRI INDUCTIVELY COUPLED COIL

(75) Inventors: Ting Qiang Xue, Shenzhen (CN); Jian Min Wang, Shenzhen (CN); Yan Hong Chen, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/018,923

(22) Filed: Jan. 24, 2008

(65) Prior Publication Data
US 2008/0180103 A1  Jul. 31, 2008

(30) Foreign Application Priority Data
Jan. 24, 2007  (CN)  ............ 2007 1 0063004

(51) Int. Cl.
*G01V 3/00* (2006.01)
(52) U.S. Cl. ................................ 324/318
(58) Field of Classification Search ......... 324/300–322; 600/410–435
See application file for complete search history.

(56) References Cited

U.S. PATENT DOCUMENTS 5,274,332 A * 12/1993 Jaskolski et al. ............ 324/318
5,939,883 A * 8/1999 Green et al. ................ 324/322
6,229,310 B1 * 5/2001 Green et al. ................ 324/318
6,577,888 B1 * 6/2003 Chan et al. ................. 600/422
6,624,633 B1 * 9/2003 Zou et al. ................... 324/318
7,397,245 B2 * 7/2008 Wohlfarth .................. 324/318

FOREIGN PATENT DOCUMENTS

CN  101086525  12/2007

* cited by examiner

Primary Examiner—Brij B. Shrivastav
Assistant Examiner—Dixomara Vargas
(74) Attorney, Agent, or Firm—Schiff Hardin LLP

(57) ABSTRACT

A mobile positioning device for an MRI inductively coupled coil, has at least one pair of coupled coils which are coupled with each other for transmitting signals, wherein one of the at least one pair of coupled coils is deployed on a surface of a patient's bed. A moveable platform is provided that can move in a direction parallel to the patient's bed, and the other one of the at least one pair of coupled coils is deployed on the moveable platform opposite to the coupled coil deployed on the patient's bed. The device can be driven by a motor or a spring. When the patient's bed needs to be placed at different positions for an examination, the coupled coil deployed on the moveable platform can be aligned completely and in parallel to the coupled coil fixed on the patient's bed by moving the moveable platform, so as to achieve the best coupling effects.

14 Claims, 5 Drawing Sheets

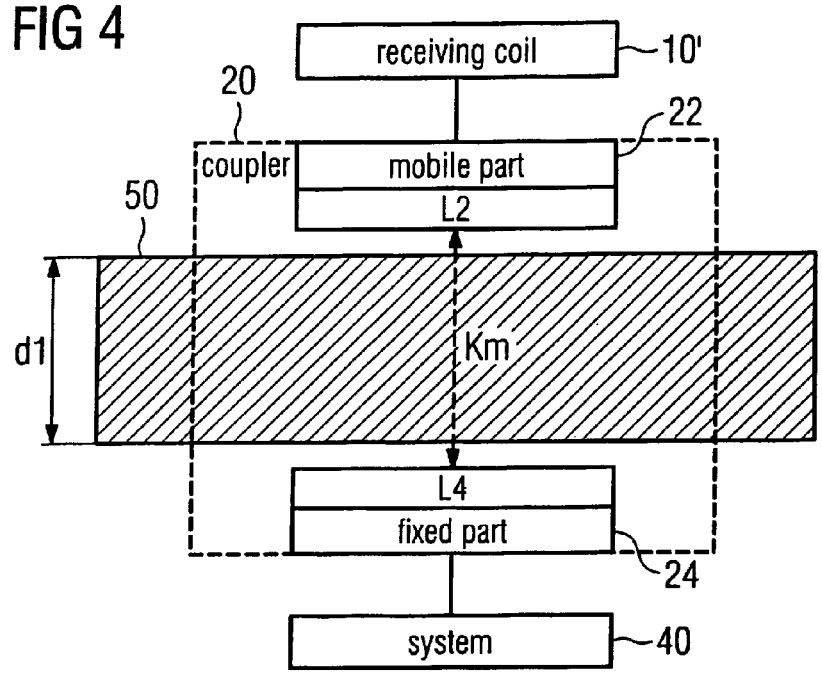
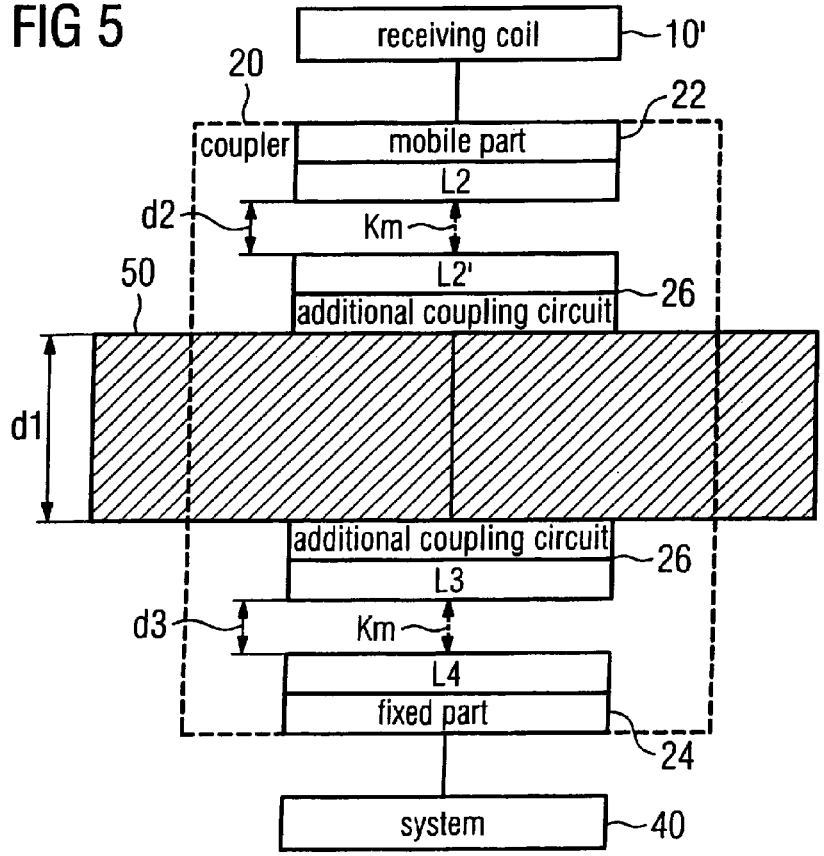

MOBILE POSITIONING DEVICE FOR MRI INDUCTIVELY COUPLED COIL

BACKGROUND OF THE INVENTION

1. Field of the Invention

The present invention relates to a mobile positioning device, particularly to a mobile positioning device for an MRI (magnetic resonance imaging) inductively coupled coil.

2. Description of the Prior Art

During an MRI data acquisition, a receiving coil is generally used to receive radio frequency signals emitted from a human body, and then the received radio frequency signals are processed for imaging. Referring to FIGS. 1 and 2, the commonly used receiving coils usually have an annular antenna design, in which: an inductor L1 and capacitors Cs and C1 are connected in serial to form a receiving coil 10 for receiving the radio frequency signals. The radio frequency signals are transmitted to a detuned circuit 11 formed by capacitor Cs and an inductor Ls. The operating status of the receiving coil 10 is controlled depending on whether a diode D1 connected with the capacitor Cs and the inductor Ls in parallel is conductive or not, the matching with the system is adjusted via a capacitor Cp connected with the capacitor Cs and the inductor Ls, then the radio frequency signals are transmitted to a plugging connector 30 via a preamplifier Preamp and a choke coil 13; and finally, they are transmitted to the system 40 via said plugging connector 30, and the system 40 is responsible for data processing in said MRI system. FIG. 3 simply shows a way of connection for such receiving coils, the receiving coil 10 is used for receiving the radio frequency signals and is connected to the plugging connector 30, and the radio frequency signals are transmitted to said system 40 via the connection between said plugging connector 30 and the system 40.

The abovementioned receiving coils have the following disadvantages: 1) since one end of the plugging connector 30 is connected to the system 40, and the other end is connected to the receiving coil 10 and the corresponding circuits, a doctor is very much restricted when placing or positioning said receiving coil 10 to receive the radio frequency signals from various body parts of a patient, and it is difficult to move freely; 2) it is easy for the plugging connector 30 to be damaged due to frequent plugging in and pulling out; 3) each receiving coil 10 is connected to a set of a preamplifier Preamp and a choke coil 13, which leads to the costs of the receiving coil being significantly increased, and in extreme cases, the choke coil connected to the receiving coil may cause injury to a patient.

In order to resolve the above problems in the current receiving coils, a design is known for an inductively coupled coil. Referring to FIG. 4, in the practical applications of the above mentioned inductively coupled coils, a receiving coil 10' is set above a patient's bed 50 for receiving the radio frequency signals, an coupler 20 is divided into two parts, one part is connected to the receiving coil 10' and this part is called the mobile part 22 of the coupler 20. The mobile part 22 has a coupled coil L2; the other part is fixed below the patient's bed 50 and on an MRI housing, and this part is called the fixed part 24 of the coupled coil and this fixed part comprises an coupled coil L4. After the receiving coil 10' has received the radio frequency signals, it transmits them to the mobile part 22 of the coupler 20; and through the coupling between the coupled coil L2 of the mobile part 22 and the coupled coil L4 of the fixing part 24, the radio frequency signals are input into the fixing part 24 of the coupler 20, and then they are transmitted into the system 40 for processing. In this way of connection between the above coupled coils, the receiving coil 10' couples the received radio frequency signals to the system 4 via the coupler 20, so that the plugging connector 30 used in the conventional receiving coil 10 showed in FIG. 1 is eliminated. Therefore, it allows the users to avoid the results due to its damage and the increased costs thereof. Furthermore, doctors can move the receiving coil 10' freely without restriction since the mobile part 22 is connected to the receiving coil 10' and is moveable freely with it, rather than that said mobile part 22 being connected with said fixing part 24. The preamplifier and the choke coil connected to the fixing part 24 can be adapted for using with various receiving coils 10', with significant cost savings, and the patient's safety is assured due to the receiving coil 10' no longer being connected to the choke coil.

To ensure the normal operation of the inductively coupled coil in the above receiving coil device, one key factor is the coupling coefficient Km between the coupled coils L2 and L4. The larger the value of the Km, the smaller the value of the loss caused by the circuit, and in an ideal case, Km=1, therefore all the signals are coupled into the system without any loss. In order to have an ideal coupling coefficient Km, there are two conditions to meet: 1) it is better if the distance between said coupled coils L2 and L4 is shorter, and in an ideal case, the distance is zero; and 2) it is better if the degree of superposition between said coupled coils L2 and L4 is larger, and in an ideal case, the two of them are parallel to and exactly opposite each other.

However, the coupled coil L2 of the mobile part 22 and the coupled coil L4 of the fixing part 24 of the coupler 20 for the aforementioned known inductively coupled coil can only be effectively coupled within a very small distance, such that the patient's bed 50 cannot be penetrated through effectively. During a coupling process, due to the thickness d1 of the patient's bed 50, the distance between the coupled coil L2 of the mobile part 22 and the coupled coil L4 of the fixing part 24 for said coupler 20 is too large, leading to the coupling coefficient Km being reduced significantly, so the loss of the circuit reaches a unacceptable level. If the mobile part 22 of the coupler 20 is deployed below the patient's bed 50, it is necessary to cut a big groove in the patient's bed 50, and since the mobile part 22 needs to be connected to the receiving coils 10', it causes difficulties during its operation for inserting in and pulling out of the groove.

Referring to FIG. 5, an improved structure of the inductively coupled coil is proposed in Chinese patent application No. 200610012126.6, in which, an additional couple circuit 26 is fitted between the coupled coil L2 of the mobile part 22 and the coupled coil L4 of the fixing part 24. The additional couple circuit 26 includes coupled coils L2', L3 which are respectively coupled with the coupled coil L2 of the mobile part 22 and the coupled coil L4 of the fixing part 24. The coupled coils L2', L3 of said additional couple circuit 26 are fitted above and below the patient's bed 50 respectively and they are connected to each other via a cable. A satisfactory coupling coefficient Km is achieved by coupling the coupled coils L2 and L2', and the coupled coils L3 and L4 respectively, wherein, the distance between L2 and L2' is d2, and the distance $d_3$ between the coupled coils L3 and L4 can be set to be very small, such that the coupling between the coupled coils L2 and L4 in the aforementioned known inductively coupled coil is no longer restricted by distance.

The coil disclosed in Chinese patent application No. 200610012126.6 easily meets the first one of the two conditions which are needed for having an ideal coupling coefficient Km mentioned above. During the practical operation of the MRI exam, after having placed the receiving coil, a doctor will move the patient's bed to bring the examinee and the receiving coil into an imaging area. In order to obtain images of various parts, the doctor needs to move the patient's bed freely, so that a specific part to be examined can be positioned in the imaging area. Since the coupled coil L3 is fitted underneath the patient's bed and is moved with the bed, while the L4 is fixed on the surface of the housing, it cannot be ensured that the coupled coil L3 and the coupled coil L4 are completely opposite each other after the patient's bed has been moved freely, therefore the coupling coefficient Km between them is affected, and therefore cannot meet the second one of the two conditions that need to be met for having an ideal coupling coefficient Km.

SUMMARY OF THE INVENTION

An object of the present invention is to provide a mobile positioning device for an MRI inductively coupled coil, that allows the degree of superposition between the coupled coils for the MRI to be freely adjusted.

The above object is achieved in accordance with the present invention by a mobile positioning device for an MRI inductive coil having at least one pair of coupled coils being coupled with each other for transmitting signals, wherein one of the at least one pair of coupled coils is deployed on a surface of a patient's bed, the mobile positioning device for the MRI inductively coupled coil further has a moveable platform which is in parallel to the patient's bed and can move in a parallel direction, and the other coupled coil of the at least one pair of coupled coils is deployed on the moveable platform and is opposite to the coupled coil deployed on the patient's bed.

When the mobile positioning device for an MRI inductive coil has at least two pairs of coupled coils, each of the coupled coils is set with a width of X and the distance between said two pairs of coupled coils is Y, and the maximum moving distance of the moveable platform relative to the patient's bed is greater than or equal to X/2+Y/2.

According to one aspect of the present invention, the moveable platform is driven by a screw-nut transmission pair, wherein the nut is set on the moveable platform, and the screw is set on a base fixed on an MRI housing. The screw is driven in rotation by using a motor, and the moveable platform is driven so as to move in a linear direction by the cooperation of the screw and the nut.

According to another aspect of the present invention, a roller is provided on the moveable platform, so as to realize the movement of the moveable platform by rolling the roller on an MRI housing. Stops are respectively provided at two sides of the moveable platform on said MRI housing to restrict the movement range of the moveable platform. A tension spring is provided between one end of the moveable platform and one of the stops, a movable pin facing toward said patient's bed is provided at the other end of the moveable platform. At least one plug facing toward the moveable platform is fixed on said patient's bed. When the first movable pin is pressed against the plug, the moveable platform is kept in an unchanged position relative to the patient's bed under the tension force of the tension spring.

When the patient's bed needs to be in different positions for examination, the coupled coil deployed on the moveable platform and the coupled coil fixed on the patient's bed can be completely in parallel and aligned by moving the moveable platform, so as to have optimum coupling effects, and the coupling between the coupled coil and other coupled coils adjacent to the coupled coil to be as reduced as possible, so as to ensure the operating efficiency of the inductive receiving coil, and to obtain high quality images by the MRI system.

DESCRIPTION OF THE DRAWINGS

FIG. 4 is an illustration showing the principles of a known inductively coupled coil for coupling radio frequency signals to a system.

FIG. 5 shows the principles of an inductively coupled coil for overcoming the problem regarding the coupling distance using an additional couple circuit in the Chinese patent application No. 200610012126.6.

DESCRIPTION OF THE PREFERRED EMBODIMENTS

Figure 1:
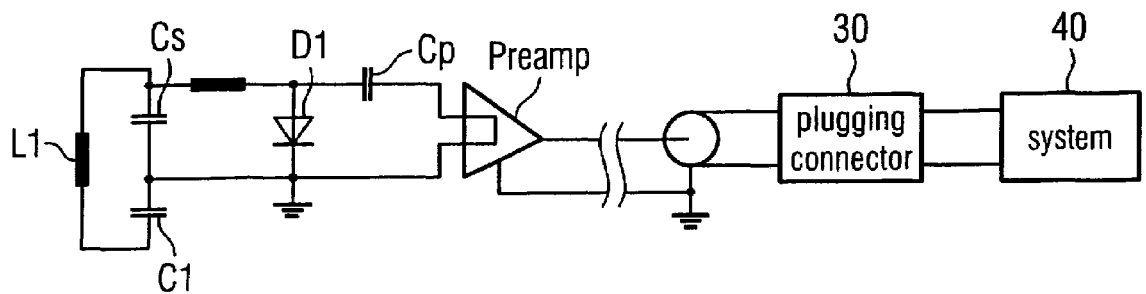
FIG. 1 is a block diagram of a current receiving coil using a plugging connector connection system.
Figure 2:
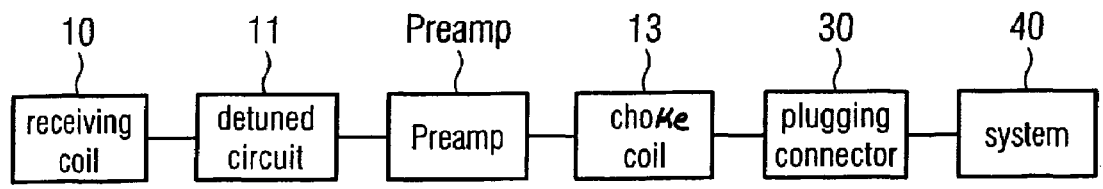
FIG. 2 is a flowchart describing the operation of the system diagram of FIG. 1.
Figure 3:
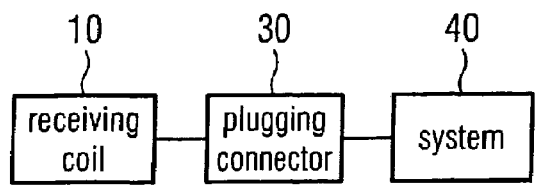
FIG. 3 is a simplification of the flowchart of FIG. 2.
Figure 6:
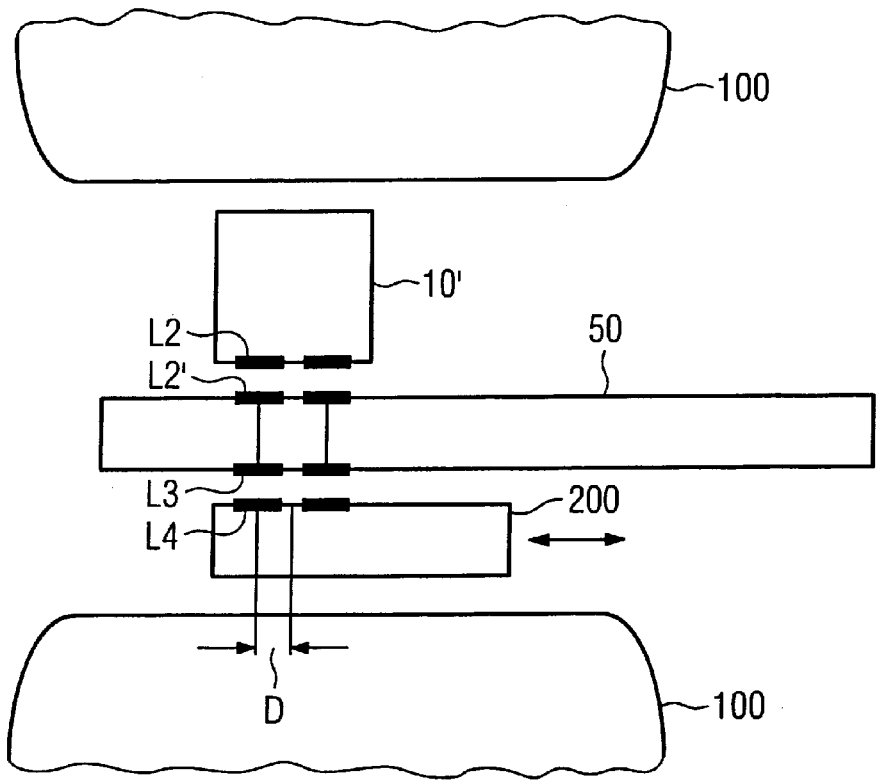
FIG. 6 is an illustration showing the structural principles of an mobile positioning device for an MRI inductively coupled coil according to the present invention, wherein the mobile positioning device for an MRI inductively coupled coil comprises a moveable platform and a coupled coil deployed on said moveable platform.

Referring to FIG. 6, a mobile positioning device for an MRI inductive coil in the present invention has at least one pair of coupled coils L3, L4 coupled with each other for transmitting signals. One coupled coil L3 of the at least one pair of coupled coils L3, L4 is deployed on a surface of a patient's bed 50. The present invention is characterized by the mobile positioning device for MRI inductively coupled coil further has a moveable platform 200 which is in parallel with the patient's bed and can move along a direction parallel to the patient's bed 50, and the other coupled coil L4 of the at least one pair of coupled coils L3, L4 is deployed on the moveable platform 200 opposite to the coupled coil L3 on said patient's bed 50.

As shown in FIG. 6, one or more of the coupled coils L3 can be deployed on one surface of the patient's bed 50, and one or more of the coupled coils L2' connected with the coupled coil L3 via a cable are deployed on the other surface accordingly. One or more of receiving coils 10' are connected with the one or more coupled coils L2. Signals received by the receiving coil 10' are transmitted by the coupling between the coupled coil L2 and the coupled coil L2'. The signals are transmitted to the coupled coil L3 via a cable, and the coupled coil L3 is coupled with the coupled coil L4 for transmitting the signals. The coupled coil L4 is further connected with the MRI system to further process the signals.

One or more of the coupled coils L4 are deployed on the moveable platform 200 corresponding to the one or more of the coupled coils L3 deployed on the patient's bed 50. The moveable platform 200 can move on a housing 100 of a MRI.

The relative position of the coupled coils L3 and L4 can be adjusted by moving the moveable platform 200 so as to achieve ideal coupling effects.

When there is more than one pair of the coupled coils L3, L4 deployed on the patient's bed 50 and the platform 200, it is assumed that each coupled coil has a width of X and the distance between adjacent two coupled coils is Y, so the maximum moving distance D of the moveable platform 200 relative to the patient's bed 50 should be larger than or equal to X/2+Y/2, so as to ensure that after one coupled coil L3 or L4 has been moved, it can at least be opposite to one coupled coil adjacent to the coupled coil L4 or L3 which it was opposite to (the coupling effects were the best at that time) immediately before having been moved.

There are many ways to move the platform 200 on the housing 100, hereinafter mainly two practical embodiments of driving with a motor and a powerless drive will be explained.

Figure 7:
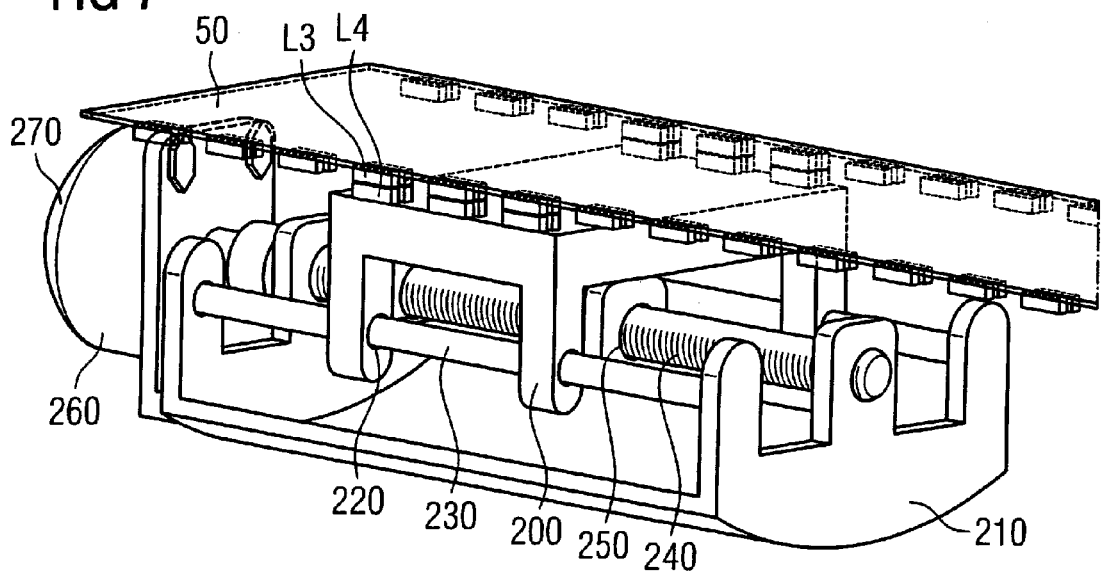
FIG. 7 is an illustration showing an embodiment of an mobile positioning device for an MRI inductively coupled coil according to the present invention, wherein the moveable platform is driven by a motor.

Refer to FIG. 7, the moveable platform 200 is driven by a screw-nut transmission pair, wherein the nut 250 is fitted on the moveable platform 200, and the screw 240 is fitted on a base 210 fixed on an MRI housing 100 (see FIG. 6). A through hole 220 is further provided on the moveable platform 200, a guide rail 230 is provided on the base 210, and the through hole 220 cooperates with the guide rail 230 so that the moveable platform 200 can move linearly along the guide rail 230.

One end of the screw 240 is connected with an output shaft of a motor 260. The screw 240 is driven by the output shaft of the motor 260 in rotation, and the moveable platform 200 is driven so as to move in a linear direction by the cooperation of the screw 240 and the nut 250. The motor 260 is a piezoelectric ceramics motor, which preferably is made of nonmagnetic materials. The motor 260 is provided with an encoder 270 for its rotating angle.

In a practical application of the MRI system, in order to achieve multi-channel signal transmission, a number of coupled coils can be arranged in an array. As shown in FIG. 7, coupled coils L4 are arranged on the moveable platform 200 in an array, the size and shape of the moveable platform 200 can be decided according to the number, spacing, and layout of the coupled coils L4 to be set thereon.

Since the screw pitch of the screw 240 is fixed, the linear moving distance of the moveable platform 200 can be controlled. When the patient's bed 50 needs to be in different positions necessary for the examination, the coupled coil L4 deployed on the moveable platform 200 can be completely aligned with the coupled coil L3 fixed on said patient's bed 50 by moving the movable platform 200, so as to achieve the optimum results. Since the moveable platform 200 is fixed on the housing 100 of the MRI apparatus via the base 210 (see FIG. 6), it is very convenient for its assembly, disassembly and maintenance.

It is also possible for the moveable platform 200 not to be limited to being driven by the motor 260, but by using driven devices such as a hydraulic cylinder driving device.

Figure 8:
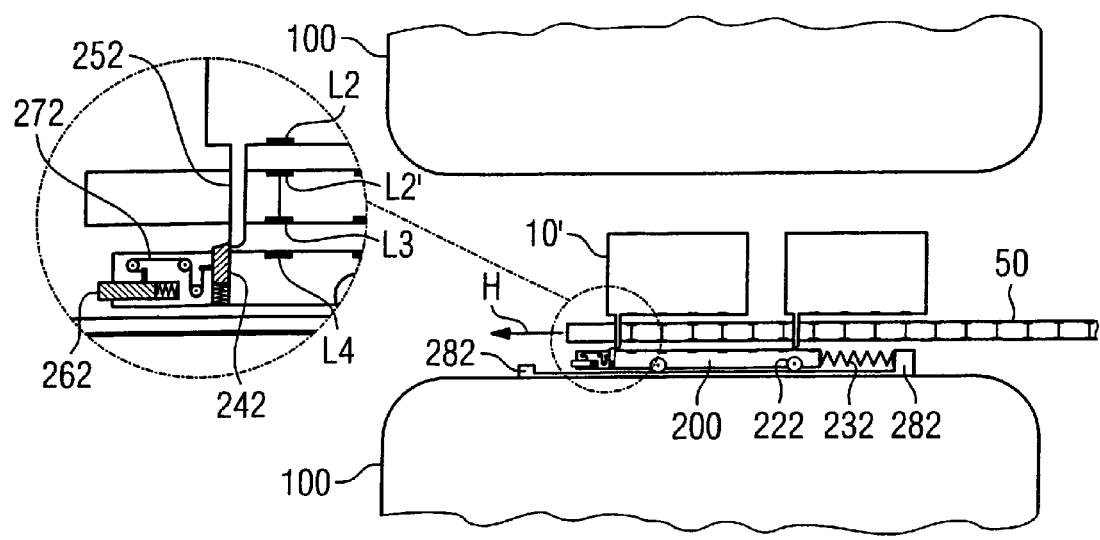
FIG. 8 is an illustration showing another embodiment of a mobile positioning device for an MRI inductively coupled coil according to the present invention, wherein said moveable platform is driven by a spring.

Referring to FIG. 8, a roller 222 is provided on the moveable platform 200, and the movement of the moveable platform 200 is achieved by the roller 222 rolling on the MRI housing 100. Stops 282 are respectively provided at two sides of the moveable platform 200 on the MRI housing 100 to restrict the movement range of the moveable platform 200.

A tension spring 232 is provided between one end of the moveable platform 200 and one of the stops 282, a first movable pin 242 facing toward the patient's bed 50 is provided at the other end. At least one plug 252 facing toward the moveable platform 200 is fixed on the patient's bed 50. The plug 252 moves with the movements of the patient's bed 50 and it can be a part of the receiving coil 10' fixed on the patient's bed 50. When the first movable pin 242 is pressed against the plug 252, the moveable platform 200 is maintained at an unchanged position relative to the patient's bed 50 under the tension force of the tension spring 232. Since when the receiving coil 10' is being fixed on the patient's bed 50, the coupled coil L2 on the receiving coil 10' and the coupled coil L2' on the patient's bed 50 are designed to be in parallel and aligned with each other. When the first mobile pin 242 is pressed against the plug 252, the coupled coil L4 on the moveable platform 200 and the coupled coil L3 on the patient's bed 50 are in parallel and aligned with each other, so as to achieve the optimum results.

At this time, the moveable platform 200 becomes a following device to the patient's bed 50. When the patient's bed 50 is moved along the direction of an arrow H by an external force due to the needs during an examination, the plug 252 moves with the patient's bed 50 along the direction of the arrow H because it is fixed on the patient's bed 50. Meanwhile, because the first movable pin 242 is pressed against the plug 252, the first movable pin 242 is driven to move in the direction of the arrow H, and since the movable pin 242 is fixed on the moveable platform 200, the platform 200 is driven to overcome the tension force of the tension spring 232 and move along in the direction of the arrow H, so that the platform 200 is maintained in an unchanged position relative to the patient's bed 50, which in turn makes the couplers L3, L4, which are parallel to and aligned with each other, continue to maintain their status as parallel to and aligned with each other. When the patient's bed 50 is moved along the direction opposite to the arrow H by an external force for the needs of the examination, the plug 252 fixed on the patient's bed 50 is therefore moved along with the patient's bed 50 in the direction opposite to the arrow H. Meanwhile, the first movable pin 242 is driven to move to the direction opposite to the arrow H under the tension force of the tension spring 232, so that it is always pressed against the plug 252, so as to maintain the platform 200 in a unchanged position relative to the patient's bed 50, which in turn makes the couplers L3, L4, which are parallel to and aligned with each other, continue to maintain their status as parallel to and aligned with each other.

The first movable pin 242 and the plug 252 each have at their respective extruding ends an inclined face, and when the first movable pin 242 is pressed against the plug 252, their inclined faces are back-to-back.

Figure 9:
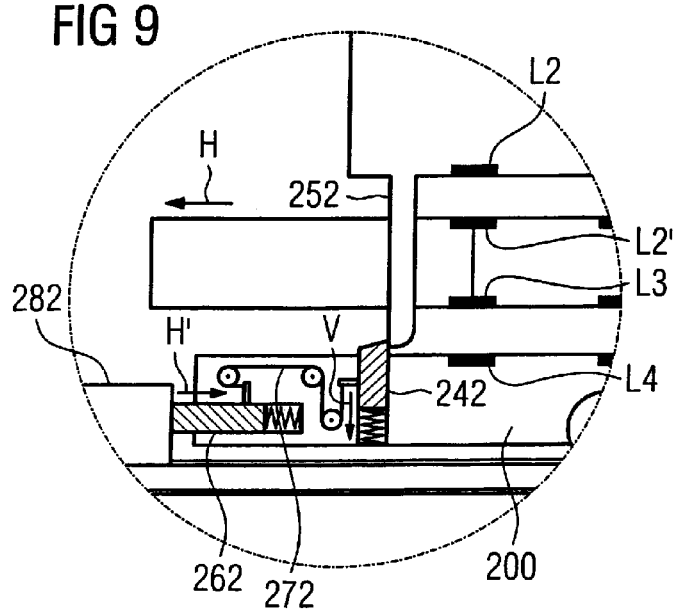
FIG. 9 is an enlargement of the details shown in FIG. 8.

At the same time, referring to FIGS. 8 and 9, the first movable pin 242 is connected with a second movable pin 262 set along the moving direction of the moveable platform 200 via a pulley block and traction belt 272, the movable pin 262 being positioned on the side of the first movable pin 242 away from the tension spring 232 along the moveable platform 200. The first movable pin 242 and the second movable pin 262 each have one respective end connected to a spring; and when the second movable pin 262 is pressed against the stops 282 to contract, the first movable pin 242 is contracted under the effects of the pulley block and traction belt 272. Particularly as shown in FIG. 9, when the inclined surfaces of the first movable pin 242 and the plug 252 are pressed against each other back-to-back, the patient's bed 50 (see in FIG. 8) moves along the direction of the arrow H by an external force, until the second movable pin 262 is in contact with the stop 282 and is compressed along the arrow H'. The first movable pin 242 is also compressed along the direction of the arrow V under the effects of the pulley block and traction belt 272, until the first movable pin 242 is disengaged from the plug 252. After the first movable pin 242 has been disengaged from the plug 252, the moveable platform 200 continues to move in the direction of the arrow H' under the effects of the tension spring 232 (see FIG. 8), until it is blocked. After the second movable pin 262 is no longer compressed by the stop 282, it is restored to its initial state, so that the first movable pin 242 is also restored to its initial state.

When the MRI apparatus has more than one receiving coil 10' and/or each of the receiving coils 10' has a number of plugs, the receiving coils and plugs needed can be selected freely in the present embodiment. Hereinafter by way of example, the patient's bed with three of the plugs 252, 252', 252" fitted thereon is described, wherein the plugs 252, 252', 252" can be a part of different receiving coils respectively, and can also be different parts of the same receiving coil.

Figure 10:
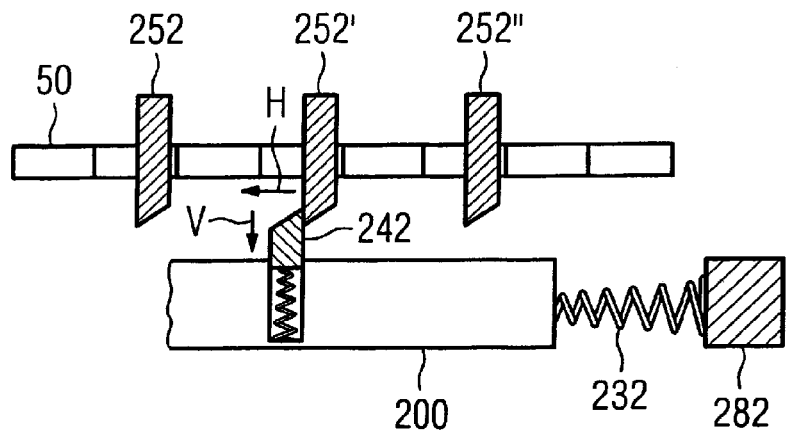
FIGS. 10-12 show a sequence of plug operation as the patient table moves.
Figure 11:
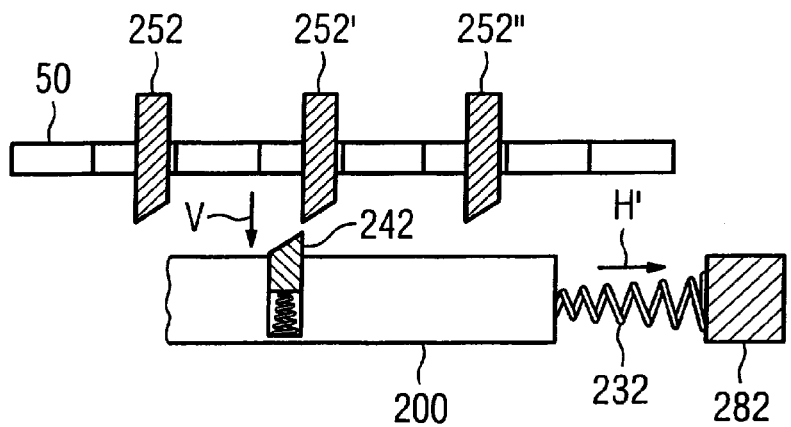

Referring to FIG. 10, one plug that is currently in use is the plug 252', the inclined surfaces of said plug 252' and said first movable pin 242 are pressed against each other back-to-back. If the plug 252" is needed as the one plug currently in use, said patient's bed 50 is pushed in the direction of the arrow H, until as mentioned above, the first movable pin 242 is compressed in the direction of the arrow V. As shown in FIG. 10, when the first movable pin 242 is disengaged from the plug 252', the moveable platform 200 is moved in the direction of the arrow H' under the tension force of the tension spring 232. After the second movable pin 262 is no longer compressed as mentioned above (see FIG. 9), the first movable pin 242 is restored to its initial state, so that it is pressed against plug 252" back-to-back, and at this moment the plug 252" becomes the plug currently in use.

Figure 12:
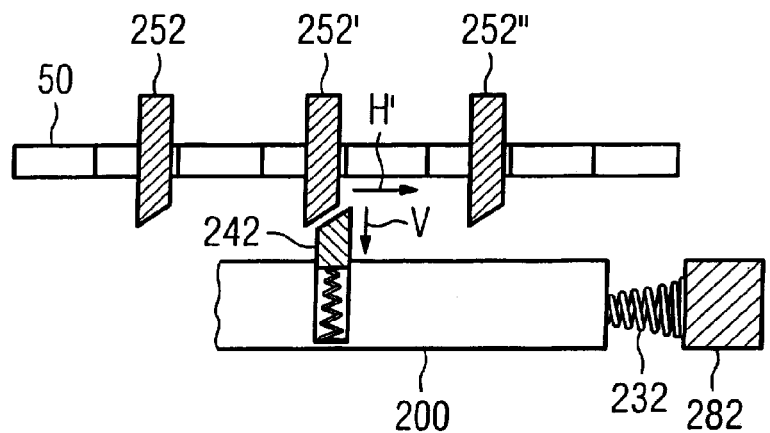

Referring to FIG. 12, assuming the plug currently in use is 252", the inclined surfaces of the first movable pin 242 and the plug 252" are pressed against each other back-to-back. If plug 252' needs to become the plug currently in use again, the patient's bed 50 is pushed along the direction of the arrow H', then the inclined surface of the plug 252' faces the inclined surface of the first movable pin 242; the patient's bed 50 is pushed further in the direction of the arrow H', the inclined surface of the plug 252' is made to compress the inclined surface of said first movable pin 242 in the direction of the arrow V, so that the plug 252' slips over the first movable pin 242; and after the plug 252' has slipped over the first movable pin 242, the first movable pin 242 is restored to its initial state because it is no longer compressed, and again it is pressed against the inclined surface of the plug 252' back-to-back under the tension force of the tension spring 232, and at this moment the plug 252' becomes the plug currently in use.

Although modifications and changes may be suggested by those skilled in the art, it is the intention of the inventors to embody within the patent warranted hereon all changes and modifications as reasonably and properly come within the scope of their contribution to the art.

We claim as our invention:

1. A mobile positioning device for a local magnetic resonance imaging (MRI) coil configured to radiate energy into or to receive detected signals from a patient on a moveable patient bed, said local MRI coil having a signal path associated therewith in which feed signals are supplied to the local MRI to cause the local MRI coil to radiate said energy and in which the detected signals received from the patient are conducted from the local MRI coil, said mobile positioning device comprising:
    a pair of inductively coupled signal transmitting coils in said signal path that are inductively coupled with each other to transmit said feed signals or said detected signals therebetween;
    a first of said inductively coupled signal transmitting coils being configured for deployment on a surface of a patient bed;
    a moveable platform separate from and configured for movement parallel to the patient bed; and
    a second of said inductively coupled signal transmitting coils being deployed on said moveable platform opposite to said first of said inductively coupled signal transmitting coils.

2. A mobile positioning device as claimed in claim 1 wherein said pair of inductively coupled signal transmitting coils is a first pair, and comprising a second pair of inductively coupled inductively coupled signal transmitting coils with a first coil of said second pair of inductively coupled signal transmitting coils being configured for deployment on said patient bed and a second coil of said second pair of inductively coupled signal transmitting coils being deployed on said moveable platform, each of said first and second coils of said first pair of inductively coupled signal transmitting coils and each of said first and second coils of said second pair of inductively coupled signal transmitting coils having a width X, and said first pair of inductively coupled signal transmitting coils and said second pair of inductively coupled signal transmitting coils having a distance Y therebetween, and wherein said moveable platform has a maximum moving distance relative to the patient bed that is greater than or equal to X/2 plus Y/2.

3. A mobile positioning device as claimed in claim 1 comprising a threaded nut attached to said moveable platform and a rotatable screw threaded in said nut, with rotation of said screw causing movement of said moveable platform parallel to said patient bed.

4. A mobile positioning device as claimed in claim 3 wherein said moveable platform has a hole therein, and wherein said mobile positioning device comprises a guide rail extending through said hole to guide said moveable platform linearly parallel to said patient bed.

5. A mobile positioning device as claimed in claim 3 comprising a motor connected to one end of said screw that rotates said screw to move said movable platform.

6. A mobile positioning device as claimed in claim 5 wherein said motor comprises an encoder that detects and controls a rotational angle of the motor.

7. A mobile positioning device as claimed in claim 1 wherein said movable platform comprises a roller configured to allow the moveable platform to roll on a housing of a magnetic resonance imaging data acquisition device.

8. A mobile positioning device as claimed in claim 7 comprising two stops respectively provided at opposite sides of said moveable platform that restrict a movement range of said moveable platform parallel to the patient bed.

9. A mobile positioning device as claimed in claim 8 comprising a tension spring between one end of said moveable platform and one of said stops, a moveable pin facing toward the patient bed disposed at an opposite end of said moveable platform, and a plug facing toward said movable platform being configured to be fixed on the patient bed, said first moveable platform, when said moveable pin is pressed against said plug, being kept in an unchanging position relative to the patient bed by a tension force produced by said tension spring.

10. A mobile positioning device as claimed in claim 9 wherein said moveable pin and said plug each has an end with an inclined face, and when said first moveable pin is pressed against said plug, the respective inclined faces are back-to-back.

11. A mobile positioning device as claimed in claim 10 wherein said moveable pin is a first moveable pin, and comprising a second moveable pin located along a moving direction of said moveable platform by a pulley block and traction belt, said second moveable pin being attached at a side of said moveable platform along which said first moveable pin is farther from said tension spring.

12. A mobile positioning device as claimed in claim 11 wherein said first moveable pin and said second moveable pin each have an end connected to a spring and, when said second moveable pin is pressed against one of said stops, said first moveable pin is contracted by said pulley block and traction belt.

13. A mobile positioning device as claimed in claim 12 wherein, when the respective inclined faces of said first moveable pin and said plug are back-to-back, said first moveable pin is disengaged from said plug due to extraction of said first moveable pin, and when the respective inclined faces of said first moveable pin and said plug are face-to-face, the inclined face of said plug compresses the inclined face of said first moveable pin by an external force, said plug slips over said first moveable pin.

14. A mobile position device as claimed in claim 1 wherein said pair of inductive coupled signal transmitting coils is a first pair, and wherein a first coil of said first pair of inductively coupled signal transmitting coils is configured for deployment at said local MRI coil and wherein a second coil in said first pair of inductively coupled signal transmitting coils is configured for deployment on said patient bed, and wherein said mobile positioning device comprises a second pair of inductively coupled signal transmitting coils with a first coil of said second pair of inductively coupled signal transmitting coils being configured for deployment on said patient bed and a second coil of said second pair of inductively coupled signal transmitting coils being deployed on said movable platform, and wherein said mobile positioning device further comprises a cable proceeding through said patient bed that electrically connects said second coil in said first pair of inductively coupled signal transmitting coils with said first coil of said second pair of inductively coupled signal transmitting coils.

* * * * *